Dec. 23, 1958 C. F. MAASS ET AL 2,866,096

CAPACITIVELY END TUNED RESONANT LINE HAVING INDUCTIVE TRACKING TRIMMER MOUNTED ON CAPACITOR ROTOR

Filed Aug. 16, 1954 2 Sheets-Sheet 1

INVENTORS
CHARLES F. MAASS
JOE D. FUNDERBURG

BY [signature]

THEIR ATTORNEY

INVENTORS
CHARLES F. MAASS
JOE D. FUNDERBURG
BY
[signature]
THEIR ATTORNEY

United States Patent Office 2,866,096
Patented Dec. 23, 1958

2,866,096

CAPACITIVELY END TUNED RESONANT LINE HAVING INDUCTIVE TRACKING TRIMMER MOUNTED ON CAPACITOR ROTOR

Charles F. Maass, Pasadena, and Joe D. Funderburg, Arcadia, Calif., assignors to Hoffman Electronics Corporation, a corporation of California Application August 16, 1954, Serial No. 449,878

3 Claims. (Cl. 250—40)

This invention is related to tunable ultra-high frequency resonators and, more particularly, to an improved tunable resonator which will exhibit uniform performance over the entire range of operating frequencies.

In the past, many attempts have been made to design a satisfactory ultra-high frequency resonator having a relatively wide tuning range. Invariably certain problems are encountered which render resonators presently in use deficient in some respect. The principal difficulty lies in the fact that tuners employing conventional resonators exhibit sporadic performance in the higher range of frequencies where the resonator-associated electrodes of the tuner vacuum tube have inter-electrode impedances which may become reduced in value to a point below the characteristic impedance of the tuning portion of the conventional tuner. It is recalled that the inter-electrode capacitive reactance, or impedance, of a vacuum tube will decrease as the operating frequency is increased. Hence, to provide proper resonance of the tuning resonators, it is important to insure that the cumulative impedance of the resonators and associated tuning elements will always remain below the inter-electrode impedance of the particular electrodes of the vacuum tube with which the tuning circuitry is associated, despite the frequency of operation. Inter-electrode impedance of commonly used vacuum tubes lies in the neighborhood of 160 ohms in the frequency range approaching 1000 mc. Other difficulties are presented in the fact that conventional ultra-high frequency tunable resonators are quite expensive to manufacture and also exhibit sporadic performances which are caused by physical discontinuities present in the physical construction of conventional tunable resonators.

Therefore, it is an object of this invention to provide an improved tunable ultra-high frequency resonator.

It is a further object of this invention to provide an improved tunable ultra-high frequency resonator construction which will lend itself to low-cost manufacture and at the same time avoid physical discontinuities in construction and sporadic performance associated therewith.

It is an additional object of this invention to provide an improved ultra-high frequency resonator which, when employed as the tuning circuitry of an oscillator, tuned amplifier or the like, will aid the oscillator or tuned amplifier in exhibiting uniform performance over the entire range of operating frequencies.

According to this invention, the resonant lines forming the major part of the resonator are constructed so as to have an unusually low characteristic impedance with the result that the input impedance to the resonator is always lower than the impedance of the vacuum tube electrodes between which the resonant lines are to be connected. Further, adjustment of the low end of the tuning range of an end-loaded tunable resonator embodying the present invention is accomplished by means of a suitably designed variable "padder" inductor connected in series with a plurality of tuning capacitors. In addition, stator portions of the tuning capacitor plurality are formed integrally with the resonant lines so as to avoid physical discontinuities between the resonators and the tuning capacitors.

The features of the present invention which are believed to be novel are set forth with particularity in the appended claims. The present invention, both as to its organization and manner of operation, together with further objects and advantages thereof, may best be understood by reference to the following description taken in connection with the accompanying drawings, in which:

Figures 1, 2, 3:
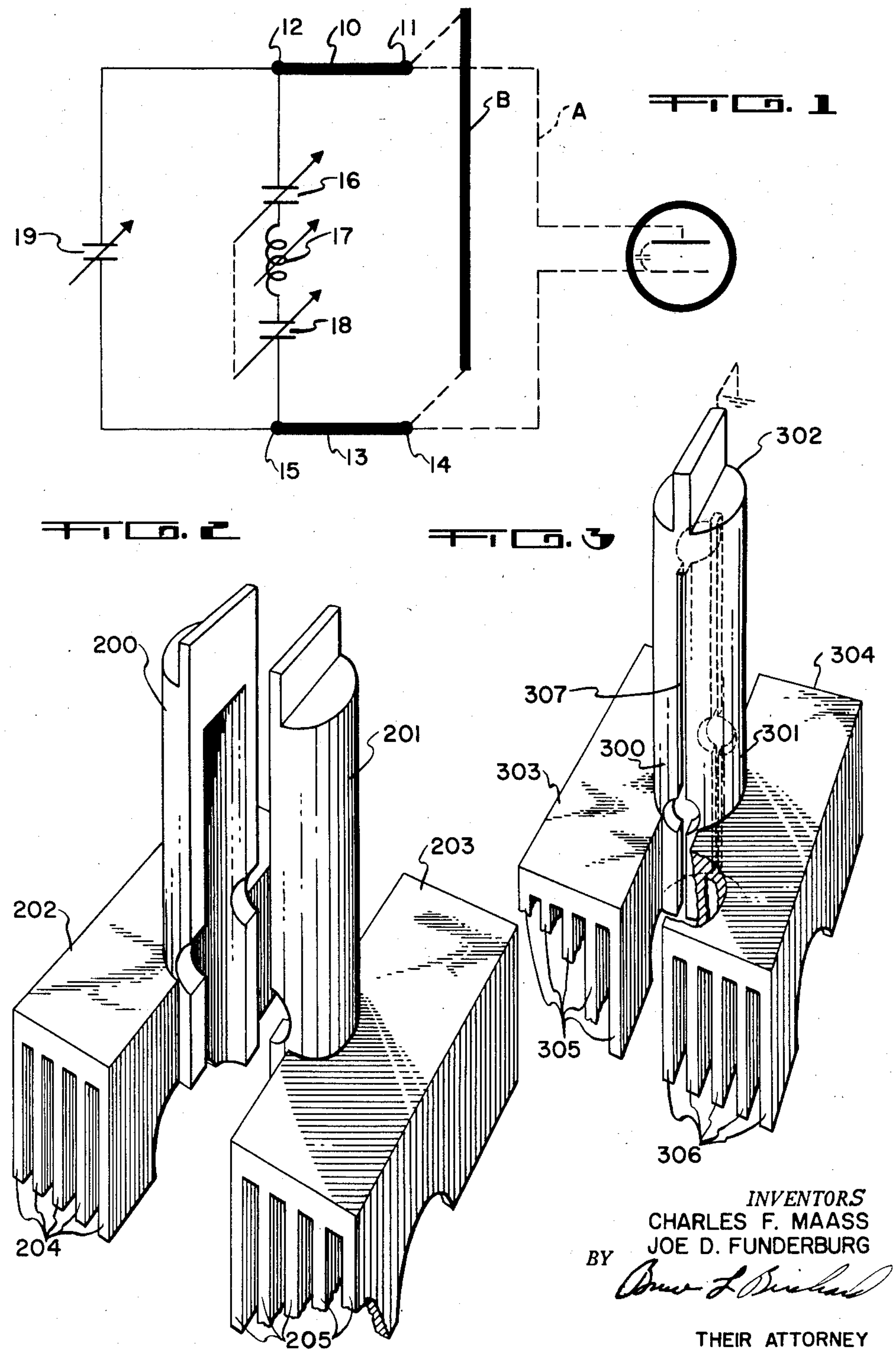
Figure 1 is a schematic diagram of a tunable ultra-high frequency resonator according to this invention.
Figure 2 is an elevational view of a pair of resonators suitable for employment in an ultra-high frequency oscillator, according to this invention.
Figure 3 is an elevational view of a resonator suitable for employment in an ultra-high frequency pre-selector stage, according to this invention.

In Figure 1, quarter wave length resonant line 10 has two terminals 11 and 12, and quarter wave length resonant line 13 has two terminals 14 and 15. Terminals 11 and 14 of resonant lines 10 and 13 are input terminals of the resonator construction when such resonator construction is employed in an oscillator circuit, as indicated by configuration A. Configuration B suggests a resonator construction readily employable in a pre-selector stage or the like. The particular design of configurations A and B shall be shown and described in Figures 2 and 3, respectively, and the discussion thereof. Terminals 12 and 15 of resonant lines 10 and 13 are coupled together through a series circuit consisting of variable capacitor 16, variable inductor 17, and variable capacitor 18, respectively. This inductive-capacitive series circuit is shunted by trimmer capacitor 19, which is employed to align the high frequency end of the operating frequency range when capacitors 16 and 18 are out of mesh. Variable capacitors 16 and 18 are ganged.

The circuit described in Figure 1 operates as follows. Frequency variation of the subject resonator is accomplished by the variation of capacitance across the remote ends of resonant lines 13 and 10, through adjustment of ganged capacitors 16 and 18. Trimmer capacitor 19 serves to align the high end of the frequency band when capacitors 16 and 18 are out of mesh. Inductor 17 may be so designed, as shall presently be demonstrated, to allow for its aligning the low end of the frequency range when capacitors 16 and 18 are in mesh.

In the ultra-high frequency range, the inter-electrode capacitance present in tuner vacuum tubes has an appreciable effect upon tuner operation. It is well known to those skilled in the art that a tuner will exhibit spurious responses owing to line or impedance discontinuities if the inter-electrode impedance of the tuner vacuum tube electrodes across which the resonator construction is connected becomes reduced in value to a point below the impedance exhibited in the resonator tuning circuitry. Therefore, it is expedient that the design of the resonant lines and of the tuning elements be such as to offer a very high factor of merit, or "Q," and that, simultaneously, the impedance of the tuning circuitry be constant and always remain less than the associated vacuum tube impedance. In addition, it may be desirous to manufacture the stator blades of the tuning capacitors integrally with their associated resonators. Suitable tunable resonator designs are illustrated in two embodiments of this invention described in Figures 2 and 3.

In Figure 2, resonators 10 and 13 of Figure 1 (configuration A) consist of two tubular hemicylindrical conducting elements 200 and 201 (shown spaced apart for clarity), to which are fixedly disposed base portions 202 and 203, respectively, and capacitor stator blades 204 and 205, respectively, associated therewith. By manufacturing each of the hemicylindrical elements integrally with its respective base portion and stator blades, line discontinuities and spurious operation resulting therefrom is avoided. In practice, each resonator, base, and capacitor blade construction may be die-cast as a single element, which will avoid physical discontinuities heretofore exhibited by conventional resonator construction, and also facilitate ease of manufacture. The hemicylindrical configuration of resonator elements 200 and 201, themselves, serves to provide a high-Q, owing to the large conducting area of each resonator; in addition, elements 200 and 201 provide a maximum distributed capacitance and a consequential resonator construction minimum characteristic impedance for any given spacing of the resonator elements. Heretofore, conventional resonant line constructions have encountered the difficulty of being limited in achieving a maximum inter-resonator capacitance since, if resonant lines are spaced too closely, arcing and associated spurious responses will occur. The resonator design of the present invention takes advantage of the familiar equation $$C=\frac{kA}{4\pi d}$$

(where C is capacitance, $k$ is the dielectric constant, A is the area of the inside wall-portions of the elements, and $d$ is the distance between the elements) by providing elements having surface areas which increase at a more rapid rate as the radius of the cavity is increased than the mean distance between such surface areas increase. Thus, an inter-resonator cavity having a sufficiently large diameter will preclude the necessity of spacing the resonators such a minimum distance apart (in order to obtain a minimum characteristic impedance) that risks of arcing and associated spurious responses are taken. In actual practice, a dielectric material may be inserted between the resonators.

In Figure 3, resonators 10 and 13 of Figure 1 (configuration B) consist of two tubular hemicylindrical legs 300 and 301 of a slotted cylindrical metallic element 302 which is closed at one end. Again, base portions 303 and 304, together with their associated capacitor stator blades 305 and 306, are fixedly disposed to resonator legs 300 and 301, respectively, to avoid line discontinuities. In practice, the entire resonator construction may be die-cast as a single unit, and thus provide a resonator exhibiting optimum performance and lending itself to low-cost manufacture. The width of slot 307 determines the low end of the tuning range, while the length of slot 307 determines the high end of the tuning range. As in the resonator design of Figure 2, the resonator design of Figure 3 contributes to an overall low impedance resonator construction by reason of the high-Q of the resonator legs and the large inter-resonator leg distributed capacitance.

Figure 4:
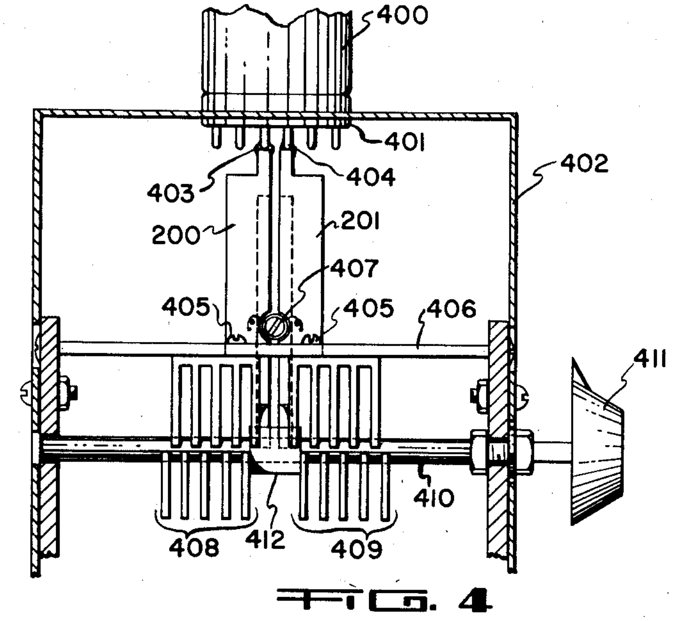
Figure 4 is an elevational view of an oscillator embodying a tunable ultra-high frequency resonator according to this invention.

In Figure 4, vacuum tube 400 is inserted into tube socket 401 of structure 402. Resonant line 200 (see Figure 2) is soldered or otherwise affixed to electrode pin 403 of socket 401. Resonant line 201 is soldered or otherwise affixed to electrode pin 404 of socket 401. Two front screws and two rear screws 405 attach the resonator construction to non-conducting base 406 of structure 402. Trimmer capacitor 407 is connected between resonators 200 and 201. Rotor plates 408 and 409 are fixed to non-conducting tuning shaft 410 which is rotated by knob 411. Located between the two sets of rotor plates 408 and 409 is variable inductive portion 412, which is secured to shaft 410.

Figure 5:
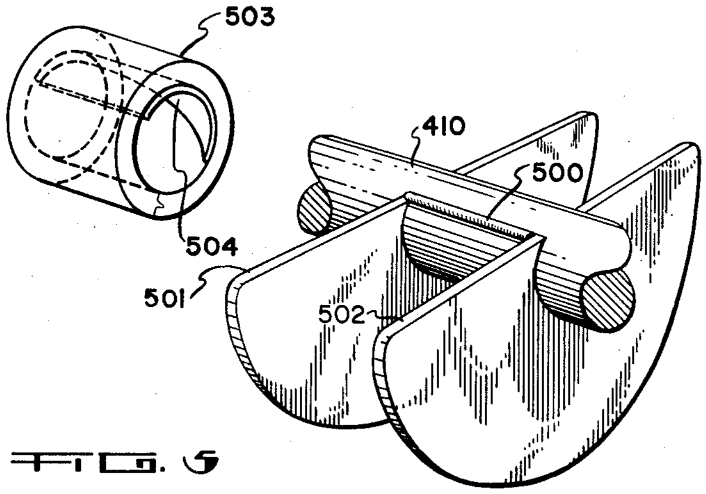
Figure 5 is an exploded view of the variable inductance portion of a tunable resonator according to this invention.

Figure 5 shows an exploded view of the essential elements of variable inductive portion 412. Located on the surface of tuning shaft 410, which is made of non-conducting material, and extending between the innermost rotor plates of the two ganged capacitors, is a thin metallic conducting strip 500 which at its ends makes electrical connection with innermost plates 501 and 502. Surrounding the portion of tuning shaft 410 which has on its surface conductor 500 is plastic tube 503. Plastic tube 503 is slit, having, for example, tongue-in-groove edges so that tube 503 may be easily slipped over tuning shaft 410. Permanently affixed to the inner wall of tube 503 is a thin metallic foil or conducting area 504 of a particular configuration. The configuration of conducting foil 504 is such that at one positioning of tube 503 conductor strip 500 will be in contact with foil 504 over its entire length, the width of this foil being tapered so that the portion of conductor 500 in contact with foil 504 decreases to a minimum value upon adjustment of tube 503. The more conducting foil 504 covers metallic conducting strip 500, the less inductance the exposed portion of conducting strip 500 will exhibit, by virtue of the random fields produced by eddy currents within conducting foil 504 and also by reason of the comparatively large area of foil 504.

The present embodiment of this invention, as depicted in Figures 1, 2, 4, and 5, operates as follows. When the plates of the tuning capacitors are fully out of mesh, trimmer capacitor 407 is adjusted to align the high end of the tuner frequency range. Upon turning tuning knob 411 to a point where the plates of the tuning capacitors are fully in mesh, variable inductance portion 412 is positioned to align the low end of the frequency range.

While the described embodiment of this invention has employed tubular hemicylindrical metallic elements as tuner resonators, solid hemicylindrical elements, or elements of other cross-sectional configuration, might also be employed. Cost considerations will dictate which of the designs is the more feasible. The object of the resonant line design is to have a large surface area so that the lines will offer little "skin-effect" resistance to ultra-high frequency current, and consequently, that an overall high factor of merit, or "Q," will result. The minimum spacing between the resonant lines and the inter-line cavity will aid in keeping the characteristic impedance of the resonator construction below the impedance existing between the tuner vacuum tube electrodes across which the resonator construction is coupled. The overall result will be a tuner free from spurious responses over the entire operating frequency range.

The tunable resonator construction described in this invention is readily adaptable for use in all classes of high frequency tuned circuits, e. g., oscillators, tuned amplifiers, antenna circuits, etc., or any combination of the same. In addition, the single split cylinder construction described herein for tuning resonators may be applied to the manufacture of ultra-high frequency transmission lines for general application.

It is to be borne in mind that the present invention is not restricted to any particular frequency range.

While particular embodiments of the present invention have been shown and described, it will be obvious to those skilled in the art that changes and modifications may be made without departing from this invention in its broader aspects, and, therefore, the aim in the appended claims is to cover all such changes and modifications as fall within the true spirit and scope of this invention.

We claim:

1. As a means for tuning, and for aligning the low end of the tuning range of an ultra-high frequency tuner, first and second ganged variable capacitors having a common tuning shaft including an electrically non-conductive portion, each of said capacitors, as disposed relative to each other upon said tuning shaft, having an innermost rotor plate, a narrow strip of conductive material fixedly disposed on said non-conductive portion and connecting said innermost rotor plate of said first capacitors with said innermost rotor plate of said second capacitor, a tubular element made of a non-conductive material, said tubular element being slit for easy application to said tuning shaft over said narrow conductive strip, and said tubular element having a conductive area on its inside surface shaped to engage a varying length of said narrow strip upon adjustment around said shaft, and means for securing said tubular element to said shaft in a position such that correct alignment inductance is attained at the low end of the tuning range of said tuner.

2. As a means for the optimum tuning of an ultra-high frequency tuner over a desired range of frequencies, a plurality of variable capacitors having a common tuning shaft made of a non-conductive material, each of said capacitors, as disposed relative to each other upon said tuning shaft, having an innermost rotor plate, a narrow strip of conductive material fixedly disposed on said shaft and connecting said innermost rotor plate of one of said capacitors with said innermost rotor plate of the corresponding adjacent capacitor, a tubular element made of a nonconductive material, said tubular element being slit for easy application to said tuning shaft over said narrow conductive strip, and said tubular element having a conductive area on its inside surface shaped to engage a varying length of said narrow strip upon rotation around said shaft, and means for securing said tubular element to said shaft in a position such that correct alignment inductance is attained at the low end of the tuning range of said tuner.

3. A tunable ultra-high frequency resonator including, in combination, a low impedance transmission line construction consisting of two hemi-cylindrical conducting elements fixedly disposed to each other so that each of the two longitudinal edges of one of said elements is parallel and in close proximity to a corresponding longitudinal edge of the other of said elements; a tuning means as a device for accomplishing the tuning and the low-frequency alignment adjustment of said resonator, including, first and second ganged variable capacitors having a common tuning shaft made of a non-conductive material, each of said capacitors, as disposed relative to each other upon said tuning shaft, having an innermost rotor plate, a narrow strip of conductive material fixedly disposed on said shaft and connecting said innermost rotor plates of said capacitors, a tubular element made of nonconductive material, said tubular element being slit for easy application to said tuning shaft over said narrow conductive strip, and said tubular element having a conductive area on its inside surface shaped to engage a varying length of said narrow strip upon rotation around said shaft, and means for securing said tubular element to said shaft in a position such that correct alignment inductance is attained at the low end of the tuning range; and one end of each of said hemicylindrical conducting elements being connected to the stator blade of a respective one of said variable capacitors of said tuning means.

References Cited in the file of this patent

UNITED STATES PATENTS

| | | |
|---|---|---|
| 2,246,928 | Schick | June 24, 1941 |
| 2,277,638 | George | Mar. 24, 1942 |
| 2,422,995 | Vorie | June 24, 1947 |
| 2,471,155 | Langmuir | May 24, 1949 |
| 2,491,480 | Davis et al. | Dec. 20, 1949 |
| 2,540,137 | Page | Feb. 6, 1951 |
| 2,564,579 | Parmenter et al. | Aug. 14, 1951 |
| 2,572,130 | Funderburg | Oct. 23, 1951 |
| 2,587,667 | Toth | Mar. 4, 1952 |
| 2,601,445 | Murakami | June 24, 1952 |
| 2,656,517 | Johnson | Oct. 20, 1953 |
| 2,710,379 | Lubben | June 7, 1955 |
| 2,803,805 | Wilson | Aug. 20, 1957 |